United States Patent [19]

Felici et al.

[11] 4,355,344

[45] Oct. 19, 1982

[54] PROTECTIVE DEVICE ELECTRONIC SEMICONDUCTOR COMPONENT

[75] Inventors: Maurizio Felici, Milan; Pietro Menniti, Badolato, both of Italy

[73] Assignee: SGS-ATES Componenti Elettronici S.p.A., Agrate Brianza, Italy

[21] Appl. No.: 124,624

[22] Filed: Feb. 25, 1980

[30] Foreign Application Priority Data

Feb. 27, 1979 [IT] Italy ............................. 20551 A/79

[51] Int. Cl.³ .............................................. H02H 5/04
[52] U.S. Cl. ................................. 361/103; 330/207 P
[58] Field of Search ........................ 361/103; 357/28; 330/298, 207 P

[56] References Cited

U.S. PATENT DOCUMENTS

| | | | |
|---|---|---|---|
| 4,092,693 | 5/1978 | Ishikawa et al. | 361/103 |
| 4,142,115 | 2/1979 | Nakata et al. | 361/103 X |
| 4,146,903 | 3/1979 | Dobkin | 361/103 X |

*Primary Examiner*—Harry E. Moose, Jr.
*Attorney, Agent, or Firm*—Karl F. Ross

[57] ABSTRACT

To protect a discrete electronic component such as a bipolar transistor or a field-effect transistor against destructive current surges, one or two ancillary transistors are formed in the same semiconductor body which has a major portion thereof overlain by an output electrode constituting a variable-voltage terminal connected to a load. This major portion, acting as the collector of the bipolar transistor (or of two such transistors in a Darlington configuration) or as the drain of the FET to be protected, also forms the collector of each ancillary transistor whose emitter is grounded through a constant-current generator or through a resistor. The emitter potential of a single ancillary transistor, or the potential difference of the emitters of two such transistors of mutually different current densities, varies as a function of temperature and is compared with a reference voltage to apply, in the event of an overload, an inhibiting signal to a driver stage for blocking or limiting the conduction of the protected component.

8 Claims, 6 Drawing Figures

PROTECTIVE DEVICE ELECTRONIC SEMICONDUCTOR COMPONENT

FIELD OF THE INVENTION

Our present invention relates to a circuit arrangement comprising an electronic component incorporated in a semiconductor body with two main electrodes connected by way of a load across a supply of operating current and with a control electrode connected to a driver stage for establishing a selected rate of energization of the load. This component may be a single bipolar transistor, a pair of such transistors connected in a Darlington configuration, or a field-effect transistor of the insulated-gate (IGFET) type.

BACKGROUND OF THE INVENTION

In operation, such a component is subjected to a certain heating effect which depends, on the one hand, on the load current and, on the other hand, on the ability of the surrounding medium to dissipate the generated heat. On the basis of the maximum permissible temperature it is possible to optimize the various electrical operating parameters of the circuit arrangement. There is, however, a risk that the component may be destroyed by overheating due to unfavorable circumstances such as, for example, an accidental short-circuiting of the load.

In integrated circuitry, in which the component to be protected against destructive overheating forms part of a semiconductor wafer along with other circuit elements, it has already been suggested to use the temperature dependence of the voltage drop across a p/n junction for the detection of incipient overheating. German published specification No. 2,718,762, for example, describes the provision of an ancillary transistor in the vicinity of a principal transistor to be protected, the two transistors being formed jointly in the same substrate; the collector current of the ancillary transistor is utilized to trip a control circuit for limiting the conduction of the principal transistor as soon as the permissible operating temperature is exceeded.

In the case of a discrete transistor formed by a semiconductor chip it has heretofore not been possible, on account of the different technique generally employed in making such a chip, to provide a similarly effective temperature sensor. The manufacture of such discrete components requires that a large portion of the semiconductor substrate, specifically a region bounded by one of the major chip surfaces, be overlain by one of the main electrodes of the component, generally the one connected by way of the load to a live terminal of the power supply whose other terminal is grounded. The main electrode referred to is the collector of a bipolar transistor (or the common collector of the pilot and final transistors of a Darlington pair) or the drain of an IGFET.

Thus, conventional protective circuitry for a discrete transistor does not directly utilize the phenomenon of a temperature dependence of a voltage drop across a p/n junction. British Pat. No. 1,476,089, for example, describes a temperature-sensing resistor thermally coupled to the casing of the component to be protected. German published specification No. 2,656,466 discloses a temperature sensor in the form of a bridge circuit including the base/emitter junction of the protected transistor in one of its arms; when the junction temperature surpasses a predetermined value, its resistance diminishes and unbalances the bridge to actuate a controller for cutting off the transistor.

Devices using separate heat-sensitive resistors as overload detectors respond only with a certain delay to an excessive rise in temperature and therefore do not provide reliable safeguards against short circuits. Such devices, moreover, require special mechanical connections between the semiconductor casing and the external resistor to assure a reasonably good heat transfer. Protective bridge circuits of the type referred to have the drawback that the base/emitter voltage $V_{BE}$ of the transistor to be protected is not invariably the proper criterion for overload detection since that voltage is affected not only by temperature but also by other parameters such as the collector and emitter currents of that transistor. A device of the latter nature, therefore, is unsuitable where these currents may vary widely in normal operation.

OBJECT OF THE INVENTION

The object of our present invention, accordingly, is to provide improved means for protecting discrete semiconductor components, especially the various types of transistors referred to, against overheating.

SUMMARY OF THE INVENTION

We realize this object, pursuant to our present invention, by the provision of temperature-sensing means including an ancillary transistor in the semiconductor body incorporating the component to be protected. This ancillary transistor has a collector zone which is part of the same conductivity region that is contacted by one of the main electrodes (collector or drain) of that component, a base zone biased to render that ancillary transistor conductive, and an emitter zone connected to protective circuitry for the control of an associated driver stage to reduce the current flow through the component whenever a monitoring signal varying with the absolute temperature of the semiconductor body, derived from the potential of the emitter zone, departs from a predetermined range to indicate an excessive temperature rise.

According to a more specific feature of our invention, the region forming the collector zone of the ancillary transistor is a substrate overlain by an epitaxial layer of the same conductivity type, the other main electrode of the protected component being in contact with a second region of the same conductivity type formed as an enclave in a portion of the epitaxial layer doped with impurities of the opposite conductivity type, the last-mentioned portion constituting an intervening third region adjoining the control electrode (base or gate) of the protected component. The emitter zone of the ancillary transistor is formed by another enclave of the first-mentioned conductivity type in an opposite-conductivity portion of the epitaxial layer.

The base zone of the ancillary transistor may be maintained at a fixed potential by an external biasing circuit, especially when the absolute magnitude of the emitter voltage of that transistor is used as the monitoring signal. With two ancillary transistors incorporated in the semiconductor body as described above, sharing a common collector zone and having interconnected bases, the monitoring signal may be the difference of their emitter voltages which allows for a more exact temperature checking. In the latter instance the bases of the ancillary transistors may be connected to the base or gate electrode of the controlled component for biasing by the control signal which determines the conduction of the protected component.

BRIEF DESCRIPTION OF THE DRAWING

The above and other features of our invention will now be described in detail with reference to the accompanying drawing in which.

SPECIFIC DESCRIPTION

Figure 1:
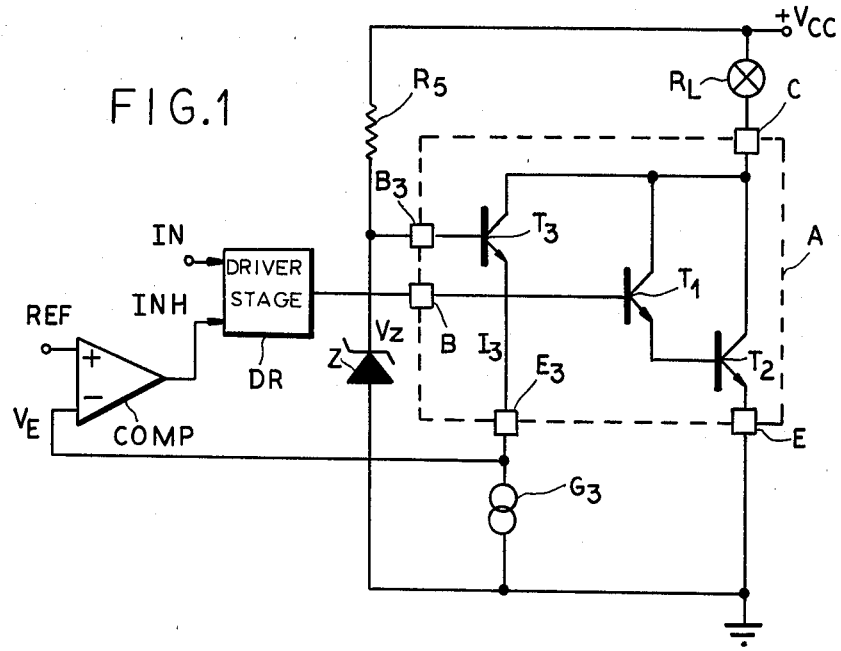
FIG. 1 is a circuit diagram of a discrete component in the form of a Darlington-type transistor pair provided with a protective device according to our invention.

In FIG. 1 we have shown a semiconductor body A incorporating a component for the controlled energization of a load here represented by a lamp $R_L$, this component comprising a pilot transistor $T_1$ and an output transistor $T_2$ interconnected in a Darlington configuration. The emitter of NPN transistor $T_1$ is directly connected, in the usual manner, to the base of NPN transistor $T_2$ whose own emitter is joined to a grounded main electrode E. The collectors of both transistors are joined to another main electrode C which is connected by way of load $R_L$ to the positive terminal $V_{cc}$ of a direct-current supply whose negative terminal is also grounded. The base of pilot transistor $T_1$ is connected to an electrode B representing the control input of the Darlington component.

Figure 2:
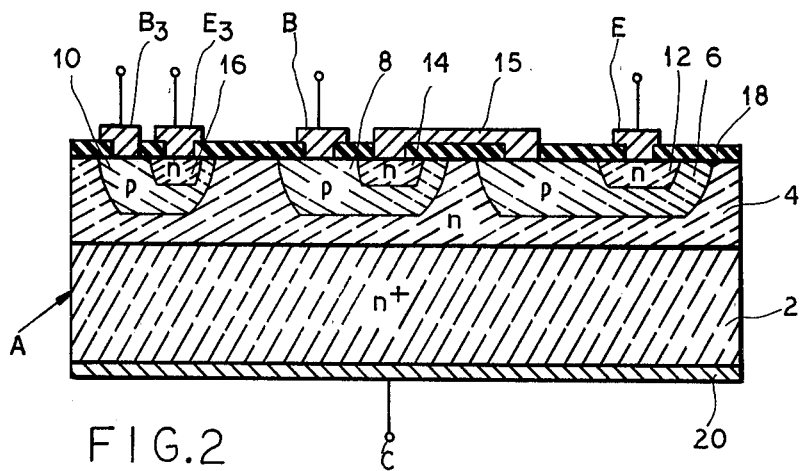
FIG. 2 is a cross-sectional view of a semiconductor body incorporating the transistor pair of FIG. 1 together with an ancillary transistor forming part of the associated protective device.

As seen in FIG. 2, collector electrode C is part of or connected to a metallic coating 20 on the underside of a substrate 2 of monocrystalline silicon of n+ conductivity overlain by an epitaxial layer 4 of conductivity n. Portions 6, 8 and 10 of this epitaxial layer are conventionally doped, e.g. by diffusion, with p-type impurities and have n-doped enclaves 12, 14 and 16. Layer 4 is covered by a layer 18 of silicon oxide which is penetrated by the emitter electrode E contacting the enclave 12. Base electrode B also penetrates the oxide layer 18 to contact the p-type region 8 whose enclave 14, constituting the emitter area of pilot transistor $T_1$, is connected with base area 6 via a conductor strip 15.

As further seen in FIG. 1, an ancillary NPN transistor $T_3$ has its collector connected to the same electrode C as transistors $T_1$ and $T_2$, its base being joined to an electrode $B_3$ and its emitter being tied to an electrode $E_3$. The two latter electrodes are shown in FIG. 2 as penetrating the oxide layer 18 and contacting the p-type zone 10 and its n-type enclave 16, respectively. Substrate 2 and epitaxial layer 4 constitute a common collector region for all three transistors.

The external circuitry illustrated in FIG. 1 further includes a driver stage DR connected to base electrode B, a biasing circuit in the form of a resistor $R_5$ in series with a Zener diode Z connected across the d-c supply with a junction point tied to electrode $B_3$, a constant-current generator $G_3$ inserted between emitter electrode $E_3$ and ground, and a comparator COMP with an noninverting input receiving a fixed reference potential REF and an inverting input receiving the emitter potential of ancillary transistor $T_3$ from electrode $E_3$. Comparator COMP works into an inhibiting input INH of driver stage DR also receiving, on another input IN, a control voltage determining the rate of energization of load $R_L$.

In operation, the emitter current $I_3$ of the ancillary transistor $T_3$ is given by the relationship $$I_3 = I_s(e^{\frac{q}{kT} \cdot V_{BE3}} - 1) \tag{1}$$

where $I_s$ is the saturation current of the base/emitter junction of transistor $T_3$, $V_{BE3}$ is the voltage drop across that junction in the presence of a forward bias, q is the charge of an electron, k is Boltzmann's constant and T is the absolute temperature (in degrees Kelvin) of the junction. Since the exponential term of equation (1) is generally considerably greater than unity, that equation may be rewritten in simplified form as follows:

$$V_{BE3} = T(k/q)\ln(I_3/I_s) \tag{1'}$$

Indicating by $V_Z$ the breakdown voltage of Zener diode Z, we obtain the following formula for the emitter potential $V_E = V_Z - V_{BE3}$ fed to the lower input of comparator COMP in FIG. 1:

$$V_E = V_Z - T(k/q) \ln (I_3/I_s) \tag{2}$$

Since the saturation current $I_s$ is essentially determined by the manufacturing process, voltage $V_Z$ and emitter current $I_3$ are fixed by the characteristics of Zener diode Z and constant-current generator $G_3$, and since the temperature of the base/emitter junction of transistor $T_3$ closely follows the temperature of output transistor $T_2$, voltage $V_E$ provides a precise indication of the instantaneous temperature of the latter transistor which dissipates the major part of the energy supplied to the component to be protected.

Reference voltage REF is so chosen that comparator COMP emits an inhibition signal only when the detected emitter voltage $V_E$ rises to a value indicating excessive heating of transistor $T_2$. The inhibition signal then causes the driver stage DR to reduce the conduction of transistor $T_2$ to a safe level.

In the foregoing discussion it has been assumed that the saturation current $I_s$ is not significantly affected by temperature changes. If this is not the case, the effect of these thermal variations of the saturation current can be eliminated by the use of the difference between the emitter potentials of two ancillary transistors of different operating characteristics as a temperature-sensing parameter. This has been illustrated in FIG. 3 which shows a circuit arrangement differing from that of FIG. 1 by the presence of a fourth NPN transistor $T_4$ whose collector and base are connected in parallel with those of transistor $T_3$ to electrodes C and $B_3$, respectively, and whose emitter is tied to an electrode $E_4$ grounded by way of constant-current generator $G_4$. The two emitter electrodes $E_3$ and $E_4$ are connected to respective inputs of a differential amplitude DIFF working into the lower (inverting) input of comparator COMP. The only modification needed in the semiconductor body A of FIG. 2 is the provision of a further n-type enclave in zone 10 contacted by the electrode E4. That further enclave, however, could also be formed in a separate base zone biased by circuit R5, Z.

The emitter currents I3 and I4 are given by the relationships $$I_3 = J_s A_3 (e^{\frac{q}{kT} \cdot V_{BE3}} - 1) \tag{3}$$

and $$I_4 = J_s A_4 (e^{\frac{q}{kT} \cdot V_{BE4}} - 1) \tag{4}$$

where $A_3$ and $A_4$ are the areas of the base/emitter junctions of transistors $T_3$ and $T_4$, respectively, $J_s$ is the current density in these areas upon saturation and $V_{BE4}$ is the voltage drop across the forwardly biased base/emitter junction of transistor $T_4$, all other symbols having the same significance as before.

The voltage difference $\Delta V_{BE} = V_{BE3} - V_{BE4}$ is fed by amplifier DIFF to comparator COMP. Assuming as before that the exponential terms of equations (3), (4) are considerably greater than unity, and further assuming the saturation-current density $J_s$ to be the same for the two ancillary transistors, we can write:

$$\Delta V_{BE} = T \frac{k}{q} \ln \left( \frac{A_3 I_4}{A_4 I_3} \right) \tag{5}$$

In order that voltage $\Delta V_{BE}$ have a finite value, it is evidently necessary that $$\frac{A_3 I_4}{A_4 I_3} \neq 1.$$

This condition can also be expressed by $J_3 \neq J_4$ where $J_3 = I_3/A_3$ and $J_4 = I_4/A_4$ represent the instantaneous current densities. Since the saturation density $J_s$ does not appear in equation (5), any possible modification thereof by temperature changes has no effect upon the monitoring signal $\Delta V_{BE}$ appearing in the output of amplifier DIFF.

Figure 3:
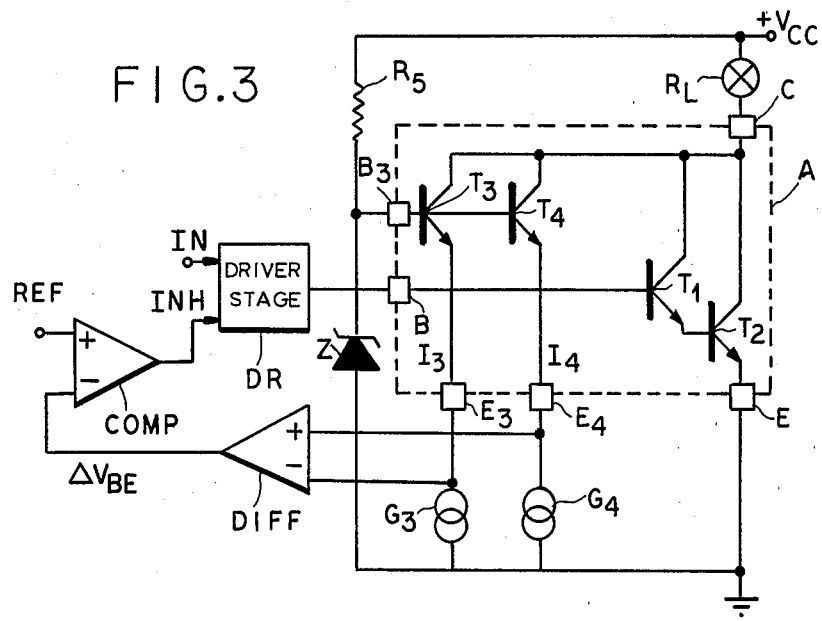
FIG. 3 is a circuit diagram similar to FIG. 1, illustrating an embodiment with two ancillary transistors.

If the two constant-current generators G3 and G4 of FIG. 3 were replaced by respective resistors designated R3 and R4, equation (5) would be changed to read:

$$\Delta V_{BE} \approx T \frac{k}{q} \ln \left( \frac{A_3 R_3}{A_4 R_4} \right) \tag{5'}$$

With $R_3 = R_4$ and $A_4 = 10 A_3$, for example, equation (5') yields a value of $2 \cdot 10^{-4} T$ (in volt·° K.) for signal $\Delta V_{BE}$.

Figure 4:
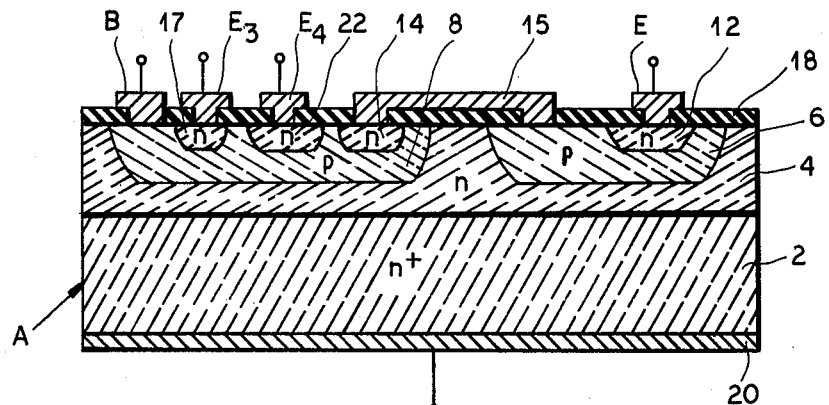
FIG. 4 is a cross-sectional view similar to that of FIG. 2 but relating to a modification of the embodiment of FIG. 3.
Figure 5:
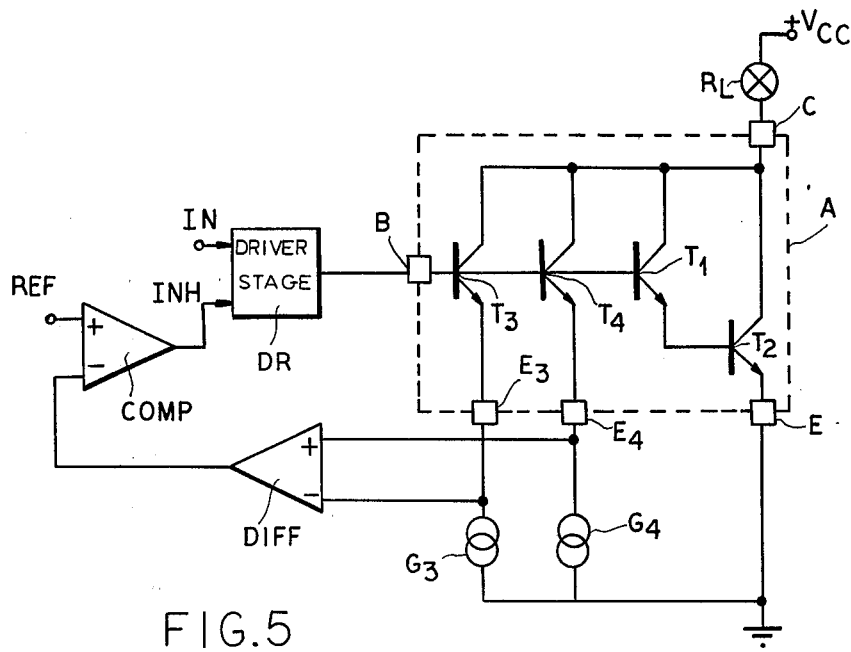
FIG. 5 is a diagram similar to FIGS. 1 and 3 but relating to the modification of FIG. 4.

As illustrated in FIGS. 4 and 5, the two ancillary transistors T3 and T4 may be biased into conduction by the output signal of driver stage DR through the common base electrode B since identical currents I3 and I4 cancel in equation (5) or (5'). FIG. 4 shows the zone 8 expanded to accommodate additional n-type enclaves 17 and 22 contacted by emitter electrodes E3 and E4, respectively. Base and emitter regions 6 and 14 are interconnected, as in FIG. 2, by a conductor strip 15. In this instance, of course, an inhibiting command emitted by comparator COMP must not completely cut off the transistors T3 and T4.

By way of further modification, the ancillary-transistor bases could be connected in parallel with the base of output transistor T2 rather than pilot transistor T1. In that instance the enclaves 17 and 22 of FIG. 4 would be formed in the base region 6. In all the circuit arrangements heretofore described, of course, the Darlington combination T1, T2 could be replaced by a single transistor.

Figure 6:
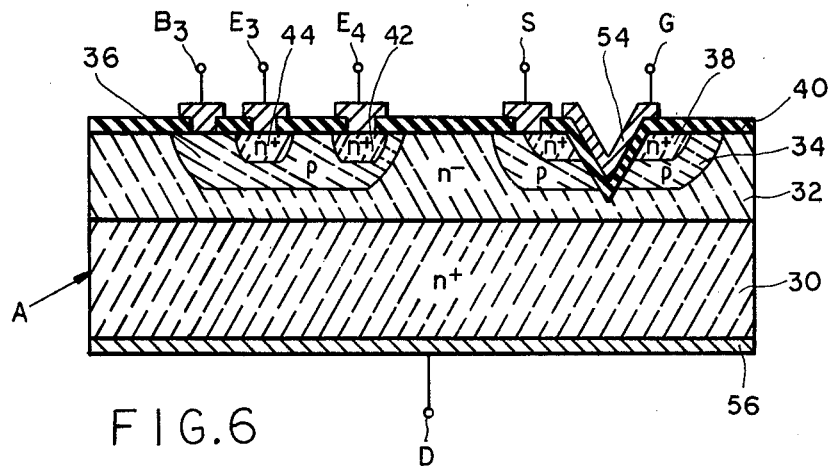
FIG. 6 is a further cross-sectional view of a semiconductor body incorporating an IGFET as the protected component.

FIG. 6 illustrates the application of our invention to an IGFET of the VMOS (vertical metal/oxide/semiconductor) type. The silicon body A is here shown to have a substrate 30 of n+ conductivity with a metallic coating 56 integral with or part of a drain electrode D for the IGFET. Substrate 30, overlain by an epitaxial layer 32 of n− conductivity, also forms the collectors of two ancillary NPN transistors with a common base electrode B3 and respective emitter electrodes E3 and E4, these three electrodes penetrating an oxide layer 40 on top of chip A. Base electrode B3 contacts a p-doped zone 36 in layer 32 containing two n+ enclaves 42 and 44 which are respectively contacted by electrodes E4 and E3. Another p-doped portion 34 of layer 32 is the site of a further enclave 38 of n+ conductivity. A source electrode S, assumed to be grounded, contacts both areas 34 and 38, these areas being bisected by a V-shaped trough lined with a part of oxide layer 40. A metallic strip 54 overlying this part of the oxide layer constitutes an insulated gate and is integral with or connected to an electrode G.

The circuitry of FIG. 6 is generally similar to that of FIG. 3, aside from the replacement of the Darlington pair T1, T2 by the IGFET with its drain, source and gate electrodes D, S and G in the positions of collector, emitter and gate electrodes C, E and B, respectively.

It will be understood that, in all the disclosed embodiments, the conductivity types p and n could be interchanged with reversal of the polarity of the power supply and interchange of the positions of Zener diode Z and resistor R5 in FIGS. 1 and 3.

We claim:
1. A circuit arrangement comprising:
    a semiconductor body incorporating an electronic component with first and second conductivity regions contacted by two main electrodes and with an intervening third conductivity region adjoining a control electrode;
    a load connected in series with a supply of operating current across said main electrodes;
    a driver stage connected to said control electrode for establishing a selected rate of energization of said load;
    temperature-sensing means including at least one ancillary transistor formed in said body with a collector zone, a base zone and an emitter zone, said collector zone being part of said first conductivity region, said body including a substrate and an overlying layer of one conductivity type constituting said first region, portions of opposite conductivity type in said overlying layer forming said third region and said base zone, and enclaves of said one conductivity type in said portions forming said second region and said emitter zone, one of said main electrodes overlying said substrate and being connected to a first terminal of said supply by way of said load, the other of said main electrodes being connected to a second terminal of said supply; and protective circuitry connected to said emitter zone for deriving from the potential thereof, upon a biasing of said base zone to render said ancillary transistor conductive, a monitoring signal varying with the absolute temperature of said body, said protective circuitry having an output connection to said driver stage for reducing the current flow through said component upon detection of a departure of said monitoring signal from a predetermined range, said protective circuitry further including a constant-current generator inserted between said emitter zone and said second terminal.

2. A circuit arrangement as defined in claim 1 wherein said component comprises a bipolar transistor with collector and emitter areas formed by said first and second regions and with a base area formed by said third region.

3. A circuit arrangement as defined in claim 1 wherein said component comprises a pilot transistor and an output transistor interconnected in a Darlington configuration, said pilot and output transistors having a common collector area formed by said first region, said output transistor having an emitter area formed by said second region, said pilot transistor having a base area formed by said third region.

4. A circuit arrangement as defined in claim 1 wherein said component comprises a field-effect transistor with drain and source areas formed by said first and second regions and with an insulated gate constituting said control electrode.

5. A circuit arrangement as defined in claim 1 wherein said protective circuitry comprises a comparator with one input connected to said emitter zone and another input connected to a point of predetermined reference potential.

6. A circuit arrangement as defined in claim 5 wherein said ancillary transistor is one of two ancillary transistors sharing said collector zone and including interconnected bases and separate emitter zones, said ancillary transistors having forwardly biased base/emitter junctions carrying different current densities, said protective circuitry further including a differential amplifier with input connections to said separate emitter zones and with an output connected to said one input of said comparator.

7. A circuit arrangement as defined in claim 6 wherein said interconnected bases are joined to said control electrode.

8. A circuit arrangement as defined in claim 5 wherein said protective circuitry further includes a biasing circuit for applying a fixed potential to said base zone.

* * * * *